United States Patent [19]

Shanahan

[11] 3,877,134

[45] Apr. 15, 1975

[54] METHOD OF MAKING UNIVERSAL WAFER CARRIER

[75] Inventor: Thomas W. Shanahan, Tempe, Ariz.

[73] Assignee: Motorola, Inc., Chicago, Ill.

[22] Filed: Jan. 2, 1974

[21] Appl. No.: 430,319

[52] U.S. Cl. ........................ 29/417; 29/412; 29/464; 29/DIG. 47; 211/41

[51] Int. Cl. ............................................ B23p 17/00

[58] Field of Search ............. 29/417, 412, 464, 557, 29/558, DIG. 4; 211/41, 40; 312/50; 432/261

[56] References Cited

UNITED STATES PATENTS

| | | | |
|---|---|---|---|
| 570,338 | 10/1896 | Reed | 211/41 |
| 1,660,210 | 2/1928 | Schaefer | 211/41 |
| 2,568,955 | 9/1951 | Englander | 248/117.2 |
| 3,502,222 | 3/1970 | Crafoord | 211/40 |
| 3,828,726 | 8/1974 | Dietze et al. | 211/41 X |

*Primary Examiner*—Richard J. Herbst
*Assistant Examiner*—Victor A. Di Plama
*Attorney, Agent, or Firm*—Vincent J. Rauner; Willis E. Higgins

[57] ABSTRACT

A semiconductor wafer carrier is described for use in a high wear environment. The constituent metal parts are preferably made of aluminum. The elements for holding a plurality of wafers are manufactured by extruding grooves in a pair of side members. An alignment notch is formed simultaneously with the wafer holding grooves. This carrier is of integral construction wherein the preferred embodiment has its members joined by staking. The low-cost feature of the carrier is of prime importance because of the high volume of such devices used. The wafer carrier is universal in nature insofar as it is compatible for use in a plurality of automatic wafer handling machines. This feature is important because it reduces, if not completely eliminates the operator training which is otherwise required for identifying the correct wafer carrier to be used with a corresponding piece of automatic wafer handling machinery.

4 Claims, 9 Drawing Figures

METHOD OF MAKING UNIVERSAL WAFER CARRIER

BACKGROUND OF THE INVENTION

Prior to the introduction of this integrally formed metal wafer carrier, wafer carriers were normally of plastic construction. The use of plastic was compatible with the then existing semiconductor processing because such wafer carriers were not placed in a wear environment. The basic reason why the wafer carriers were not placed in a wear environment was because the carriers did not take an active role in the processing of the wafers carried therein. This is contrasted to the present view of wafer carriers because such carriers are now used in active processing steps; for example, spinning, developing, baking, alignment, transfer, automatic inspection, and other loading and unloading operations. When the environment changed from a non-wear environment to a wear environment, the first wafer carriers available were assembled by screws or other fasteners which are susceptible to loosening during such processing steps. Such loosening meant that the operator, using such a carrier, could not leave his post during such use because if the carrier lost a screw or other fastener, such device would jam the automatic equipment and cause damage far exceeding the cost of the carrier. Also, the wafers undergoing the processing step would be damaged and would have to be discarded.

Since the carriers are used by the thousands in the semiconductor industry, one of the chief aspects of such carriers is their low cost. The main elements of this wafer carrier are joined by staking, which is not new in itself, but which is a more permanent type of construction than the use of screws. While the staking does loosen during use, the loosening power is much slower and there usually is no catastrophic failure, i.e. separation of the staked member from the carrier element. The loosening of the staking member can usually be discovered by periodic inspections of the wafer carriers and the elements can be restaked for continued use. Additionally the wafer carrier held together by screws can come apart to the extent that one wafer held in one notch can fall against a wafer in the next adjacent notch. This can cause jamming of the automatic wafer handling machinery. Using the staked form of construction, this will not happen. While a certain degree of separation would occur using staking, there is never a parting of the elements used in forming the carrier.

The method of constructing these wafer carriers includes the extrusion of the notches in the side members of the carrier. This is the principal step in the method for making the low cost carrier. Because of the dimensions involved, it was not anticipated that an extrusion could be used.

SUMMARY OF THE INVENTION

Figure 1:
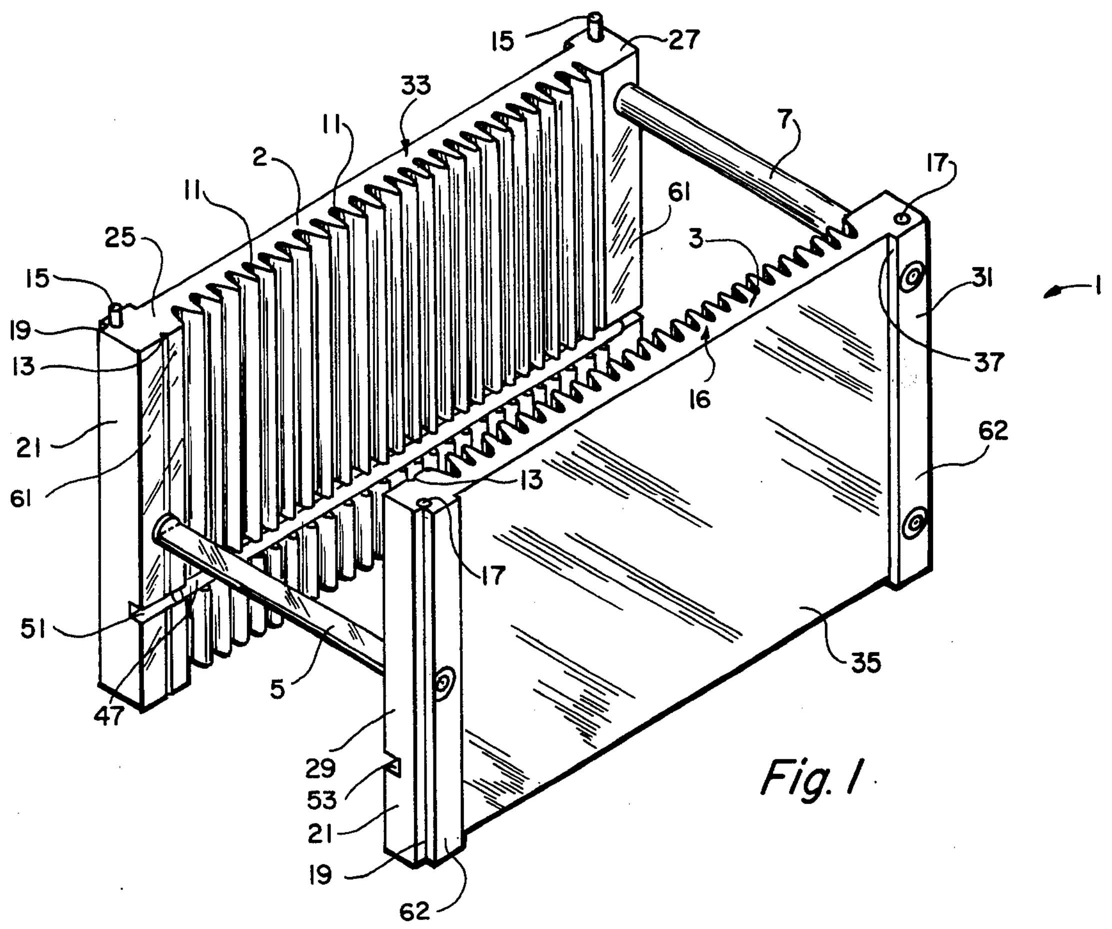
FIG. 1 shows a perspective view of the wafer carrier.

The present invention relates to wafer carriers and the method for fabricating such wafer carriers, and more particularly, the present invention relates to a new wafer carrier design and the method for making such wafer carrier for use in automatic wafer handling machinery.

It is an object of the present invention to provide a low-cost wafer carrier using a staked body construction and extruded aluminum members.

It is a further object of the present invention to provide a wafer carrier having universal use in automatic wafer handling machinery.

It is a still further object of the present invention to provide a universal wafer carrier of integral construction having integrally carried alignment means for use in automatic wafer handling machinery.

It is another object of the present invention to provide such alignment means wherein side-to-side alignment is provided by an alignment bar provided at the input face of the wafer carrier and a front-to-back alignment means located in the side member.

A still further object of the present invention is to provide a front-to-back alignment notch located in the extruded side element of the universal wafer carrier.

It is another object of the present invention to provide a method for manufacturing the universal wafer carrier using extruded side panels for defining the spacing of adjacent wafers and for separating such wafers held in the carrier.

It is another object of the present invention to provide a wafer carrier having a plurality of separately manufactured elements joined together by staking.

Another object of the present invention is to provide a universal wafer carrier fabricated with a minimum number of elements.

BRIEF DESCRIPTION OF THE INVENTION

The present invention is directed to a new wafer carrier and a method for assembling such wafer carrier. The major elements of the wafer carrier comprise the side members which provide the main structural elements as well as the individual means for carrying a plurality of wafers. The preferred form of means for carrying the plurality of wafers are a plurality of extruded grooves formed in the side members.

In addition to the major side panels, a pair of separators are positioned in the back end of the carrier for establishing the spacing between sides of the wafer carrier. A single separator means is carried in the front end of the wafer carrier.

As the wafer carrier contains two major side elements, one of the side elements carries an alignment pin extending from the top of the side element while the second major side panel carries spacing holes. This allows one of a pair of carriers to be easily aligned on top of the other, for transferring in one step the plurality of wafers in one wafer carrier to a second wafer carrier. Each of the side major elements also carries a wafer stop bar made of a relatively resilient material wherein the wafers can fall the full depth of the carrier into the wafer carrier and not be chipped, broken or otherwise damaged in their fall. The structural element used in the front of the wafer carrier for establishing the distance between side elements is also used as the side-to-side orientation bar by the automatic wafer handling machinery. A vertical groove is also carried by the front surface of the side element for determining the orientation of the two side elements of the wafer carrier.

DETAILED DESCRIPTION OF THE INVENTION

Referring to FIG. 1 there can be seen a perspective view of the wafer carrier 1. A pair of side elements are shown at 2 and 3 joined together by a single separator bar 5 located at the front of the wafer carrier. A pair of separator bars 7 and 9 (FIG. 3) are located at the back portion of the wafer carrier. The preferred embodiment employs a round aluminum bar for these separators 5, 7 and 9. While the preferred material used throughout the carrier is aluminum, an entire plastic carrier can be constructed. The plastic carrier can be used in non-wear environments or in environments specifically requiring such material, for example, an etching environment. In this manner the wafers can be etched while being held in the wafer carrier.

Referring again to the side elements 2 and 3 of the carrier 1 shown in FIG. 1, there can be shown a plurality of grooves 11 shown in each of the side members. The size of these grooves are shown as actual size. A plurality of such grooves are formed in each side of the carrier. Alignment between pairs of grooves is achieved by making the sides 2 and 3 in the same extrusion die. The die forms the wafer holding grooves 11 as well as an alignment notch 13 at the same time. Additionally, both sides 2 and 3 are made in one continuous strip of aluminum at a time. The strip is cut into at least two pieces and the alignment notch 13 in each side are aligned before staking. The formation of the alignment notch 13 at the same time as the formation of the wafer holding grooves provides an accurate means for aligning each pair of wafer holding grooves. More specifically, any inaccuracy in the cutting operation does not affect the alignment of the grooves 11 as the alignment of the notches 13 cancels the inaccuracy of the cutting operation and assures the alignment of the grooves 11 in sides 2 and 3.

Figures 2, 3, 5:
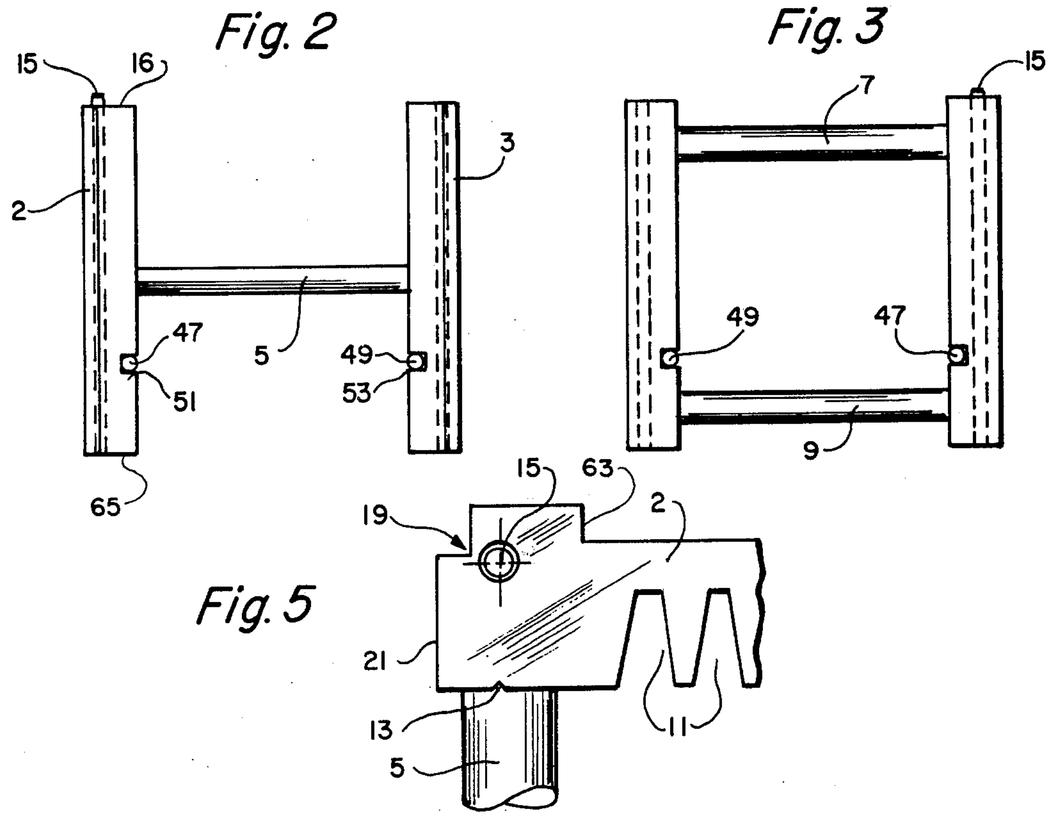
FIG. 2 shows a front view of the carrier shown in FIG. 1.
FIG. 3 shows a rear view of the carrier shown in FIG. 1.
FIG. 5 is an enlargement of that portion of FIG. 4, contained within the circle 5'.

Referring to the side element 2, a pair of alignment pins are shown at 15. These alginment pins are shown in FIG. 2 at 15 and extend above the top surface 16 of the side element 2. The side element 3 carries a pair of alignment holes 17. These alignment holes are for use in conjunction with a second wafer carrier wherein the corresponding alignment pins 15 of the second carrier are inserted into the alignment holes 17 while the alignment pins 15 of the first carrier are inserted into corresponding holes 17 of the second carrier and the wafers are transferred from one carrier to the second carrier in one flipping action.

Referring again to FIG. 1, there can be seen the front alignment locator means 19 carried by the front surface 21 of the first and second side members 2 and 3. The functioning of the front-to-back alignment locator means will be described hereinafter. The side elements 2 and 3 are provided with a substantially massive fronnt columnar and rear columnar portions generally indicated at 25, and 27; and 29 and 31, respectively. The side web elements themselves shown at 33 and 35 are relatively thin because essentially no structural stress is experienced in the sides 33 and 35. The front and rear columnar portions 25, 27, 29 and 31 carry the stress. Notches shown in each of the columnar members 25, 27, 29 and 31 and 37 and carried across the length of the sides 33 and 35 are used to lighten the mass of the side elements 33 and 35. This allows ease of handling and reduces the load on the automatic wafer handling machinery in the movement of such devices.

The identical elements shown in the several views will be identified by the same numerals.

Figure 6:
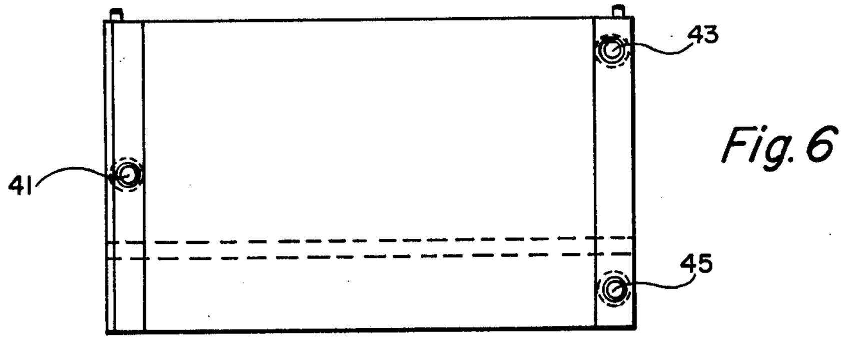
FIG. 6 shows a side view of the outside of the carrier shown in FIG. 1.

Referring to the side view shown in FIG. 6, there can be seen the means for attaching the side elements 2 and 3 to the front separator means 5 and the rear separator means 7 and 9. Staking pins are shown at 41, 43 and 45 for holding the side elements 2 and 3 to these separator rods 5, 7 and 9. Obviously, a sufficient plurality of staking pins are used in conjunction with side 3 for attaching that side 3 to the opposite ends of the separator bars 5, 7 and 9.

Referring to the front view as shown in FIG. 2, as well as the back view shown in FIG. 3, there can be seen the pair of wafer stop bars 47 and 49 contained within a notch indicated generally at 51 and 53 formed by internal surfaces of the side elements. The notches 51 and 53 are formed by a separate cutting operation either before or after the step of extruding the grooves 11.

Figure 4:
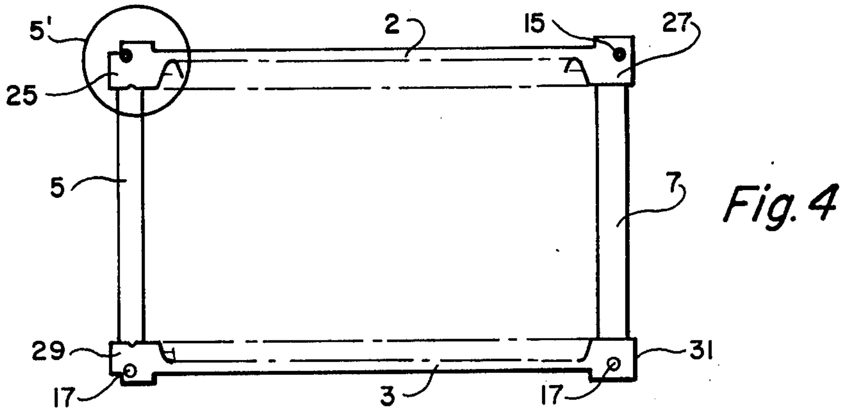
FIG. 4 shows a top view of the carrier shown in FIG. 1.

Referring to FIG. 5 there can be seen an enlargement of a portion of the top view shown in FIG. 4. This view 5 shows the alignment notch 13 carried in the first and second sides 2 and 3 which are used during the assembly of the wafer carrier.

Since the notch 13 is formed at the same time as the wafer holding grooves 11, the alignment of the notch in side 2 with the notch 13 in side 3 automatically aligns all the grooves 11 in side 2 to the grooves 11 in side 3. The front alignment means 19, carried by the columns 25 and 29 are adapted to operate with corresponding alignment means forming part of the automatic wafer handling equipment using these carriers.

Figure 7:
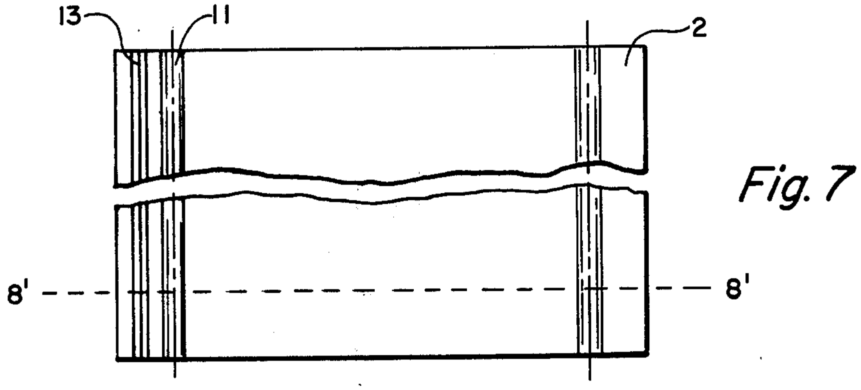
FIG. 7 shows a side view of the inside of the carrier shown in FIG. 1.
Figure 8:
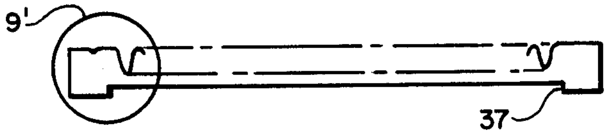
FIG. 8 is a sectional view taken along the line 8'—8' in FIG. 7.

Referring to FIG. 7, there is shown a view of the side member 2, clearly showing the relationship of the notch 13 and a groove 11. FIG. 8 shows a cross-sectional view of the side member 2 showing the relative sizes of the notch 13 and groove 11. Also the notch 37 is also shown.

Figure 9:
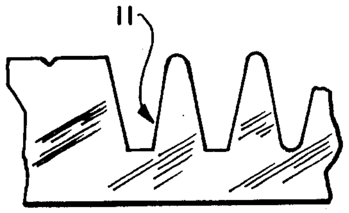
FIG. 9 is an enlargement of that portion of FIG. 8 contained within the circle 9'.

FIG. 9 is a magnified view of a portion of the side member 2, showing the notch 13 and grooves 11.

The alignment means 19 carried in the front surface 21 of columns 25 and 29 are used for centering the wafer carrier such that the wafers coming out of the wafer carrier do not hit against the mechanical portion of the air track used as part of the automatic wafer handling machinery. More specifically, the air tracks employed have vertical projections defining the width of the air bearing track and hence the wafers must float between such projections. Therefore, the waver carrier must be oriented such that the wafers being removed from the carrier are received on the track between these upright projections. The wafers are approximately three inches in diameter and the projections are about 3⅛ inches apart. Hence there is an eighth of an inch tolerance. The round orientation bar 5 is used to space the wafer carrier back from the air bearing. In the event that the wafer carrier is too far from the air bearing difficulty is experienced in getting the wafers out of the carrier.

The wafer carrier 1 shown in FIG. 1 is normally positioned such that the columnar portions 25 and 29 define the leading edge of the wafer carrier and the columnar portions 27 and 31 define the trailing edge of the carrier. Each of the columnar portions have a leading surface 21, inside surface 61, outside surface 62 and a trailing surface 63 best shown in FIG. 5. The web 2 extends from the trailing surface of the leading columnar portion, such as 25, and extends to the leading surface of the trailing columnar portion 27.

The notch 13 is carried conveniently by the inside surface 61 of the leading columnar portions 25 and 29. The notch 13 could just as well be carried by the inside or outside surfaces 61 or 62 of the trailing columnar portion or the outside surface 62 of the leading columnar portion of the side element 2 or 3. The important feature is that the orientation member 13 is formed in the same extrusion die or the grooves 11 on a surface or surfaces which carry both the grooves 11 and notch 13. In this manner the alignment of the notches 13 automatically aligns the grooves 11.

The locator means 19 are carried by the leading edge columnar portions 25 and 29. The locator means in the preferred embodiment is the notch 19 formed at the intersection of the leading surface 21 and side surface 62 of the columnar portions. The grooves 51 and 53 are formed in a convenient distance above the bottom surface 65 of the element 2 or below the top surface 16 of the side elements 2.

METHOD OF MANUFACTURING A WAFER CARRIER

A piece of aluminum having a length many times its width is fed through the extrusion die to form the grooves 11 used for carrying the wafers. At the same time the grooves 11 are formed, the alignment notch 13 is formed. The aluminum stock from which the side elements are formed already include the columnar sections 25 and 27. In this manner, the wafer holding grooves 11 along with the alignment notch 13 are formed in side-by-side relationship down the length of the piece of aluminum stock. The piece of aluminum stock is fed lengthwise through the die, thereafter it is subdivided into individual side elements by cutting along the width of the stock. The cutting is therefore perpendicular to to the grooves. The individual pieces now resemble the side elements 2 or 3. Two such pieces are placed in a fixture for assembling the wafer carrier. The fixture includes means for aligning the alignment notches 13. Once the notches 13 are aligned, all the remaining wafer carrying grooves 11 are automatically aligned. At this point the separator rods are placed between the side elements and a staking operation completes joining all the major elements together to form the carrier.

While the five major pieces of the wafer carrier are in the fixture, holes 17 are drilled in both sides 2 and 3. Holes are allowed to remain in one side 3 for use as orientation holes, while in the other side 2 pins 15 are inserted into the holes to act as orientation pins. In one form of the method, the grooves 51 and 53 are formed at the same time as the cutting of the stock into individual pieces. While the joined elements are held in the assembly fixture, the Teflon stop bars 47 and 49 are inserted into the grooves 51 and 53 and the wafer carrier is completely fabricated.

While the invention has been particularly shown and described in reference to the preferred embodiments thereof, it will be understood by those skilled in the art that changes in form and details may be made therein without departing from the spirit and scope of the invention.

What is claimed is:

1. A method for assembling a universal wafer carrier for use in automatic wafer handling machinery comprising the steps of:
   - providing a length of aluminum stock material from which the side elements of the wafer carrier are to be formed;
   - passing such aluminum stock through an extrusion die for forming wafer holding grooves simultaneously with the formation of a wafer orientation notch;
   - dividing said extruded aluminum stock into at least two pieces;
   - forming at least a single additional groove perpendicular to both the notch and grooves previously formed in each of the pieces;
   - selecting a pair of individual pieces and placing them in an assembly fixture for aligning the orientation grooves in said pieces; and
   - selecting a plurality of separator bars and placing them between the pieces and joining the plurality of separator bars to the pieces by staking.

2. The method as recited in claim 1 and further comprising the steps of:
   - drilling a plurality of holes in the top surface of the pieces forming the side elements of the wafer carrier;
   - placing a pair of pins for use as orientation pins in a pair of holes located in one of the pieces.

3. The method as recited in claim 1 and further comprising the step of:
   - press fitting a resilient member in each of the notches last formed in the lower portions of the wafer carrier sides.

4. The method as recited in claim 1 and further comprising the steps of:
   - drilling a plurality of holes in the top surface of the pieces forming the side elements of the wafer carrier;
   - placing a pair of pins for use as orientation pins in a pair of holes located in one of the pieces; and
   - press fitting a resilient member in each of the notches last formed in the lower portions of the wafer carrier sides.

* * * * *